United States Patent [19]

Kawakami

[11] Patent Number: 5,328,519
[45] Date of Patent: Jul. 12, 1994

[54] SOLAR CELLS

[75] Inventor: Soichiro Kawakami, Hikone, Japan

[73] Assignee: Canon Kabushiki Kaisha, Tokyo, Japan

[21] Appl. No.: 778,889

[22] PCT Filed: May 7, 1991

[86] PCT No.: PCT/JP91/00603
§ 371 Date: Jan. 6, 1992
§ 102(e) Date: Jan. 6, 1992

[87] PCT Pub. No.: WO91/17572
PCT Pub. Date: Nov. 14, 1991

[30] Foreign Application Priority Data

May 7, 1990 [JP] Japan .................. 2-115825

[51] Int. Cl.$^5$ ............................. H01L 31/05
[52] U.S. Cl. ..................................... 136/244
[58] Field of Search .......................... 136/244

[56] References Cited

U.S. PATENT DOCUMENTS 4,568,409  2/1986  Caplan .................. 156/643
4,754,544  7/1988  Hanak ..................... 437/2

FOREIGN PATENT DOCUMENTS 58-21827   5/1983  Japan ................... 136/244
58-54513  12/1983  Japan ................... 136/244
60-123074  7/1985  Japan ................... 136/244

Primary Examiner—Aaron Weisstuch
Attorney, Agent, or Firm—Fitzpatrick, Cella, Harper & Scinto

[57] ABSTRACT

A solar cell comprising a plurality of photovoltaic elements electrically serially connected with each other on a common conductive substrate, each of said photovoltaic elements comprising a first insulating layer, a first electrode layer, a semiconductor layer, and a second electrode layer laminated in this order on the common conductive substrate, and each pair of the adjacent photovoltaic elements being electrically serially connected by electrically connecting the first electrode layer of one adjacent photovoltaic element to the second electrode layer of the other adjacent photovoltaic element, characterized in that a second insulating layer is disposed between said first insulating layer and the end portion of said first electrode layer and a second insulating is disposed between the region of said first electrode layer serving to perform said serial electrical connection and said first insulating layer.

11 Claims, 4 Drawing Sheets

SOLAR CELLS

FIELD OF THE INVENTION

The present invention relates to a solar cell comprising a plurality of photovoltaic elements integrated on a conductive substrate.

BACKGROUND OF THE INVENTION

In recent years, heating of the earth because of the so-called greenhouse effect due to an increase of atmospheric $CO_2$ has been predicted. Thus, there is an increased demand for a means of power generation capable of providing clean energy without causing $CO_2$ buildup. Nuclear power generation has been considered to be advantageous in view of not causing $CO_2$ buildup. However, possible problems concerning leakage of injurious radioactive materials from the nuclear power generation system, treatment of radioactive wastes, and the like have not yet been completely eliminated. Thus, nuclear power generation cannot yet be a sufficiently safe power source of supplying clean energy. In this respect, public attention has been recently focused on power generation by solar cells as it is safe and supplies clean energy without those problems as above mentioned. As for solar cells, there are great expectations since they are safe and easily handled.

As for solar cells, a number of proposals have already been made. Among the proposed solar cells, amorphous silicon or copper indium selenide solar cells have been spotlighted and various studies have been made thereon since they can be easily designed to be of a large area and they can be provided at a relatively reduced production cost.

In general, it is required for solar cells to excel in weather resistance, shock resistance, and flexibility. In order to meet these requirements, a metal (conductive) substrate is often used as their substrate.

In order to obtain a desired electromotive force from a solar cell, generally a plurality of photovoltaic elements respectively comprising a photovoltaic layer are disposed on a conductive substrate made of stainless steel, etc. and connected to photovoltaic elements by means of wiring.

FIG. 4 is a schematic diagram of a known solar cell module comprising a plurality of photovoltaic elements serially connected with each other by means of wiring materials. In FIG. 4, reference numeral 400 indicates a conductive substrate, reference numeral 401 a lower electrode, reference numeral 402 a semiconductor layer (photovoltaic layer), reference numeral 403 an upper electrode, reference numeral 404 a collecting electrode, and reference numeral 405 a wiring material for electrically connecting adjacent photovoltaic elements.

Japanese patent publications Sho. 58-21827 and Sho. 58-54513 propose a method of integrating a plurality of solar cell elements on a common insulating substrate by means of masked evaporation or the like. As a modification of said method, there is known a method in which an insulating layer is applied onto the surface of a conductive substrate, metal electrode patterns are successively formed by means of masked evaporation or the like, and the metal electrode of one photovoltaic element is connected to the transparent electrode of the adjacent photovoltaic element (subcell) disposed on the same substrate. FIG. 5 is a schematic diagram of a known solar cell module comprising a plurality of photovoltaic elements integrated on a common substrate by means of masked evaporation. FIG. 5(a) is a plan view of said solar cell module, and FIG. 5(b) is a schematic cross-section view taken along the line 505-506 of the solar cell module shown in FIG. 5(a). In FIG. 5, reference numeral 500 indicates a conductive substrate, reference numeral 501 an insulating layer, reference number 502 a lower electrode, reference number 503 a semiconductor layer (photovoltaic layer), and reference numeral 504 a transparent electrode as an upper electrode.

As for the method of connecting a plurality of photovoltaic elements by means of serial wiring, there are problems in that the connecting step is time consuming and the product obtained thereby becomes unavoidably costly.

Likewise, as for the method of serially connecting a plurality of photovoltaic elements on a common substrate by means of the masked evaporation, there are problems in that it is difficult to precisely align the required masks, particularly in the case of producing large area modules. In addition to this, a variety of masks are required in order to comply with a desired power capacity and/or a desired shape; and as a result, the product obtained thereby becomes unavoidably costly.

As above described, there is known a solar cell module formed by integrating a plurality of photovoltaic elements respectively disposed on an insulating substrate. There has been proposed a method of performing integration of the photovoltaic elements in this case by use of a laser beam.

However, in the case where the laser beam processing is employed in order to integrate a plurality of photovoltaic elements respectively provided with a common conductive substrate such as a metal, a laser beam is irradiated on a conductive electrode (for example, a metal electrode) formed on the insulating layer disposed on the conductive substrate to thereby pattern said conductive electrode. In this case, portions of the conductive substrate which are situated under portions of the metal electrode to be removed through patterning are often fused to cause short-circuits between the metal electrode and the conductive substrate. In addition, because of this, it becomes difficult to connect a plurality of photovoltaic elements (subcells) through serial connection on a common conductive substrate.

Similarly, in the case of electrically connecting the upper electrode to the lower electrode by means of a laser beam, short-circuits are often caused between the conductive substrate, the upper electrode, and the lower electrode.

Thus, there are a number of problems required to be solved in the case of employing laser beam processing for the production of a solar cell using a conductive substrate.

In order to avoid occurrence of the foregoing short-circuits with respect to the conductive substrate in the laser beam processing, there is a method in which the insulating layer is so thickened as to prevent the laser beam from impinging the conductive substrate. However, it is extremely difficult to form a thick film on a large area surface of flexible substrate in a uniform and flat state without causing film peeling. And it is not advisable to apply a thick film comprising a rigid inorganic material on the entirety of said surface in view of the flexibility required for a solar cell. Further in addition, in the case where the entirety of said surface is coated by such thick film, there is also a problem that cracks are apt to occur and when those cracks occur, short-circuits are unavoidably caused between the metal electrode and the conductive substrate.

In view of the above, there has not been up to now decisive means by which the foregoing problems in the prior art can be effectively solved.

SUMMARY OF THE INVENTION

The present invention makes it an object to eliminate the foregoing problems in the known solar cell comprising a plurality of photovoltaic elements (subcells) on a conductive substrate and to provide a solar cell which satisfies the requirements with respect to weather resistance, shock resistance, and flexibility, which provides a desired electromotive force and power capacity, which enables one to optionally design the shape thereof, and which can be mass-produced.

The present invention has been accomplished as a result of extensive studies by the present invention in order to attain the above object.

The solar cell provided according to the present invention is of a constitution as will be described below.

That is, it is a solar cell comprising a plurality of photovoltaic elements electrically serially connected with each other on a common conductive substrate, each of said photovoltaic elements comprising a first insulating layer, a first electrode layer, a semiconductor layer, and a second electrode layer laminated in this order on said common conductive substrate, each pair of adjacent photovoltaic elements being electrically connected by electrically connecting the first electrode layer of one adjacent photovoltaic element to the second electrode layer of the other adjacent photovoltaic element, characterized in that a second insulating layer is disposed between said first insulating layer and the end portion of said first electrode layer and a second insulating layer is disposed between the region of said multi-divided first electrode layer serving to perform said serial electrical connection and said first insulating layer.

In the solar cell thus contained in the present invention, since the second insulating layer is disposed between the first insulating layer and the first electrode layer on the conductive substrate, excess energy of the laser beam used in connecting a plurality of photovoltaic elements (subcells) to obtain a solar cell module is absorbed by said second insulating layer. Because of this, the first electrode layer is prevented from being connected to the conductive substrate while passing through the first insulating layer, and as a result, the first electrode layer is prevented from being short-circuited with the conductive substrate.

The solar cell of the present invention excels in weather resistance, shock resistance and flexibility, and stably provides a supply of power over a long period of time even under severe use environments without causing short-circuits since it is disposed on a conductive substrate such as metal or the like.

BRIEF DESCRIPTION OF THE DRAWINGS

In the following, the present invention will be explained in more detail with reference to the drawings, wherein.

DETAILED DESCRIPTION OF THE PREFERRED EMBODIMENTS

Figure 1:
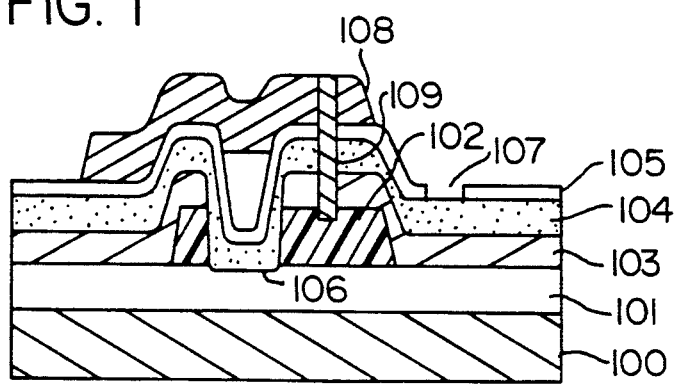
FIG. 1 is a schematic diagram illustrating an example of the constitution of the solar cell according to the present invention.
Figure 2A:
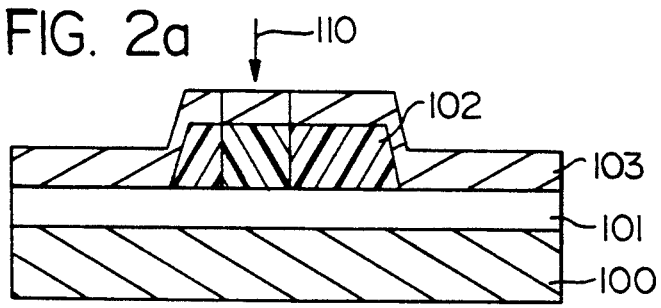
FIGS. 2A-2C are schematic diagrams illustrating the steps of producing the solar cell shown in FIG. 1 by integrating a plurality of photovoltaic elements.
Figure 2B:
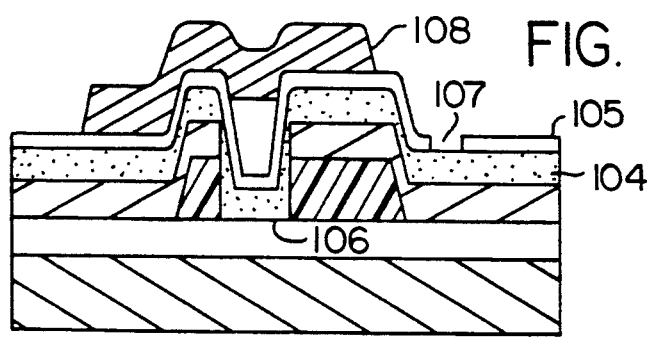
Figure 2C:
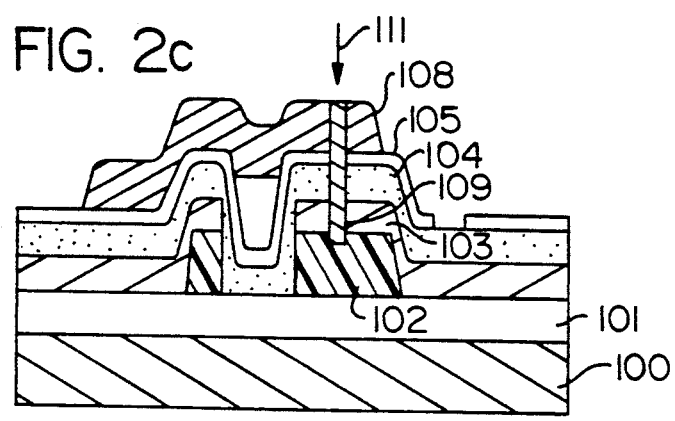

In FIGS. 1 and 2, reference numeral 100 indicates a conductive substrate, reference numeral 101 a first insulating layer, reference numeral 102 a second insulating layer, reference numeral 103 a conductive electrode comprising for example a metal, reference numeral 104 a semiconductor layer, reference numeral 105 a transparent electrode, reference numeral 106 a portion including the second insulating layer 102 and the conductive electrode 103 which is removed by irradiation of a laser beam, reference numeral 107 a portion of the transparent electrode 105 which is removed, reference numeral 108 a collecting electrode, reference numeral 109 an electrically connected portion of the conductive electrode 103, the semiconductor layer 104 and transparent electrode 105 which is formed by irradiation of a laser beam, and each of reference numerals 110 and 111 indicates a laser beam.

Explanation will be made of the process of producing the solar cell shown in FIG. 1 obtained by integrating a plurality of photovoltaic elements on a conductive substrate.

First, a first insulating layer 101 is formed on a conductive substrate 100, then a second insulating layer 102 is formed thereon, and an electrode layer 103 is formed. (FIG. 2(A))

Part of the electrode layer 103 is removed by irradiating laser beam 110 to thereby divide the electrode layer 103. A semiconductor layer 104 and a transparent electrode layer 105 are then successively formed. Thereafter, part of the transparent electrode layer 105 is removed to establish a dividing portion 107 by which a photovoltaic element is divided into a plurality of photovoltaic elements (subcells). A collecting electrode 108 is then formed. (FIG. 2(B))

In order to connect the adjacent photovoltaic elements (subcells) in series with each other, laser beam 111 is irradiated to connect the collecting electrode layer 108, transparent electrode layer 105, and the electrode layer 103. Thus, there is obtained a solar cell comprising a plurality of photovoltaic elements being integrated. (FIG. 2(C))

As the material of which the first insulating layer 101 is composed, there can be illustrated inorganic materials such as silicon oxide, silicon nitride, silicon carbide, alumina, etc. The first insulating layer is desired to be composed of a material that does not contain organic components liable to contaminate and provide negative effects on the semiconductor layer and the electrode layer formed after the formation of the first insulating layer.

As the method of forming the first insulating layer, there can be illustrated a conventional film-forming method capable of forming a large area and uniform film, such as sputtering, CVD (chemical vapor deposition), etc.

The thickness of the first insulating layer is desired to be in the range of 3000 Å to 2 μm in consideration of its function to prevent occurrence of short-circuits between the conductive substrate and the metal electrode, flexibility of the solar cell, productivity of the solar cell and the like.

The material of which the second insulating layer is composed in the present invention must be such that is neither deformed nor deteriorated during the successive steps of forming the semiconductor layer and the transparent electrode layer. In addition, it is desired to have a heat resistance temperature of more than 150° C.

As materials which satisfy these requirements, there can be illustrated resin materials of polyimide, polyphenylene sulfide, polyphenylene oxide, polyamideimide, polyester imide, polybenzimidazole, silicone, epoxy, etc., and sinterable materials such as glass paste. These materials may be colored with the use of a colorant so that they effectively absorb the laser beam used for producing the solar cell of the present invention. As such a colorant, there can be illustrated pigments such as amorphous carbon black, $Al_2O_3$, copper oxide, manganese dioxide, cobalt oxide, chromium oxide, $\alpha$-$Al_2O_3$ type solid solution of $(Cr,Fe)_2O_3$, $(Co,Ni)O(Cr,Fe)_2O_3$ spinel type solid solution, spinels of $CoO.nAl_2O_3$, spinels of $(Co,Zn)O.nAl_2O_3$, $2(Co,Zn)O.SiO_2$, uremite type solid solutions, etc.

With regard to the second insulating layer, it is required to form said second insulating layer such that it is able to prevent occurrence of short-circuits due to irradiation of the laser beam used for preparing the solar cell of the present invention. In view of this, it is desired to form the second insulating layer at a thickness of 10 to 50 μm by an appropriate method capable of forming said second insulating layer precisely at a predetermined position. Specifically, as a method of forming the second insulating layer by using an inorganic material, there can be illustrated a method in which a solution of metal alcoholate, silanol compound, or metal alkylate is applied and the resultant is subjected to heat treatment and a coating method in which a paste obtained by dispersing fine particles of the selected inorganic material into a resin is used. Likewise, as for the case where a resin material is used, there can be illustrated a method in which a paste-like resin solution is applied in a predetermined pattern by means of a screen printer or a dispenser, and the resultant is subjected to heat treatment followed by drying.

As for the thickness of the second insulating layer, it is required to have such a thickness that excess energy of the laser beam is effectively absorbed by the second insulating layer to thereby prevent the first insulating layer and the conductive substrate situated under the second insulating layer from being adversely affected. Specifically, it is desired to be in the range of 10 to 50 μm.

The electrode layer may be formed by resistance heating evaporation, electron beam evaporation, sputtering, CVD, or an impurity diffusion method.

In order to prepare the solar cell of the present invention by integrating a plurality of photovoltaic elements (subcells), an appropriate laser processing device is used. Representative examples of the light source of the laser processing device are Nd:YAG lasers and excimer lasers. The laser processing device is equipped with an oscillator, an optical unit, and an autofocusing mechanism.

Figure 6:
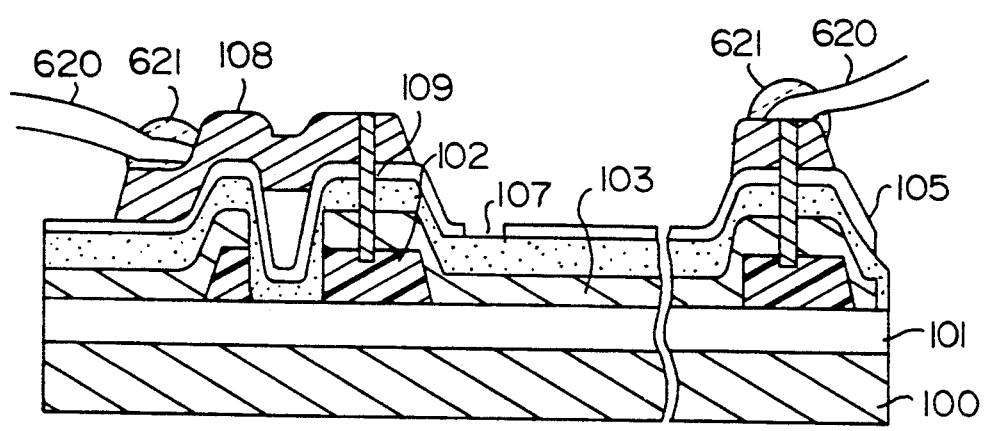
FIG. 6 is a schematic view illustrating a configuration of the solar cell with power output terminals.

FIG. 6 illustrates an embodiment when the solar cell shown in FIG. 1 is added with opposite power output terminals. The solar cell shown in FIG. 6 is the same configuration as the solar cell shown in FIG. 1, except for having a power output portion. The meanings of the reference numerals 100, 101, 103, 105, 107, 108 and 109 in FIG. 6 are the same as those of the corresponding reference numerals in FIG. 1. Therefore, description of these reference numerals is omitted. In FIG. 6, reference numeral 620 indicates a power output lead wire comprising a conductive material such as a metal. The power output lead wire 620 is electrically connected to the electrically connected portion of the conductive electrode 103. Reference numeral 621 indicates a member to fix the power output lead wire 620 to the solar cell body. The fixing member 621 is composed of a solder or a conductive paste. The embodiment shown in FIG. 6 shows the configuration wherein opposite output terminals are disposed on the surface side of the solar cell shown in FIG. 1 comprising a plurality of photovolatic elements being integrated.

In the following, the present invention will be explained in more detail with reference to examples. However, the present invention is not restricted to these examples.

EXAMPLE 1

Explanation will be given of an example of the solar cell comprising a plurality of amorphous silicon photovoltaic elements integrated on a conductive substrate while referring to FIGS. 1 and 2.

FIG. 1 shows a schematic diagram illustrating an example of the solar cell according to the present invention. In this example, there were used a stainless steel film as the conductive substrate 100, silicon nitride as the first insulating layer 101, polyimide resin as the second insulating layer 102, aluminum as the electrode layer 103, a pin junction amorphous silicon layer as the semiconductor layer 104, $In_2O_3$—$SnO_2$ (ITO) as the transparent electrode layer 105, and silver paste as the collecting electrode. A YAG laser was used for the laser processing.

In the following, the steps of preparing the foregoing solar cell will be explained with reference to FIG. 2.

Firstly, a 0.15 mm thick stainless substrate 100 having a ground surface was well cleaned. On the surface of said substrate there was deposited a 2 μm thick silicon nitride film as the first insulating layer 101 by plasma CVD using $SiH_4$ gas and-$NH_3$ gas. Then, polyimide resin was used to form the second insulating layer 102. Specifically, the formation of the second insulating layer 102 was performed as follows. That is, photosensitive resin was applied onto a metal mesh plate, and the resultant was subjected to pattern exposure and development. Insoluble portions were removed to obtain a printing plate. Then, using the resultant printing plate, polyimide resin PIX-3500 (trademark name) produced by Hitachi Chemical Co., Ltd. was applied by means of screen printing in a predetermined patterned form, which was followed by heat treatment at 90° C. for an hour and at 350° C. for 30 minutes to thereby cure the polyimide resin, whereby a 15 μm thick second insulating layer was formed.

Thereafter, Al was evaporated by a sputtering method to form a 5000 Å thick Al layer as the electrode layer 103. A YAG laser was irradiated on part of the Al electrode layer 103 (see FIG. 2(A)) to divide the electrode layer 103 into plural parts. In this case, as the YAG laser, a Q-switching pulse laser with a frequency of 4 KHz was used, wherein the average laser power was 0.4 W and the scanning speed was 100 mm/sec.

The stainless substrate having the first insulating layer 101, the second insulating layer 102, and the electrode layer 103 formed thereon was transferred to a capacitive-coupled type glow discharge film-forming apparatus, wherein a pin junction amorphous silicon semiconductor layer 104 was formed by glow discharge decomposition process under the conditions shown in Table 1.

TABLE 1

| Semiconductor Layer | Raw Material Gas | Flow Rate (sccm) | Pressure (Torr) | Substrate Temperature (°C.) | High Frequency Power (W) | Layer Thickness (Å) |
|---|---|---|---|---|---|---|
| n-type a-Si layer | SiH$_4$ H$_2$ PH$_3$ (H$_2$) | 30 40 10 | 0.5 | 250 | 50 | 200 |
| i-type a-Si layer | SiH$_4$ H$_2$ | 30 40 | 0.5 | 250 | 50 | 3700 |
| p-type a-Si layer | SiH$_4$ H$_2$ BF$_3$ (H$_2$) | 30 40 10 | 0.5 | 250 | 50 | 100 |

Then, on the semiconductor layer 104 there was formed a 800 Å thick ITO film as the transparent electrode 105 by a resistance heating evaporation method.

Thereafter, part of the transparent electrode layer 105 was removed by screen-printing an etching agent comprising a paste-like material obtained by mixing FeCl$_2$, HCl, ethylene glycol, and starch on the transparent electrode layer 105, to thereby form a dividing portion 107 by which a cell is divided into a plurality of subcells. On the transparent electrode layer 105 there was then applied a silver paste (trademark name: No. 5007, produced by Du Pont Company) at a thickness of 20 μm by screen-printing, to thereby form the collecting electrode 108. (See FIG. 2(B).)

In order to connect the photovoltaic elements (subcells) in series, a YAG laser was irradiated over the collecting electrode 108 to thereby fuse the collecting electrode 108, the transparent electrode layer (comprising ITO) 105, the semiconductor layer 104, and the metal electrode layer 103 to establish an electrical connection between the collecting electrode 108, the transparent electrode layer (comprising ITO) 105, and the metal electrode layer 103, whereby an amorphous silicon solar cell comprising an integrated plurality of photovoltaic elements (subcells) was formed. In this case, as the YAG laser, the same one as used in dividing the metal electrode layer 103 was used, wherein the average laser power was 0.9 W. In this example, the collecting electrode 108 was formed, but the latter can be omitted in the case where the width of each of the subcells is narrow, that is, the width of the transparent electrode layer is narrow and its resistance value can be disregarded.

Further, in this example, the pin junction semiconductor layer 105 was constituted by an amorphous silicon single layer, but it can be a multi-layered structure comprising, for example, pin/pin, pin/pin/pin, or the like, wherein amorphous silicon carbide or amorphous silicon germanium can be used.

Figure 3:
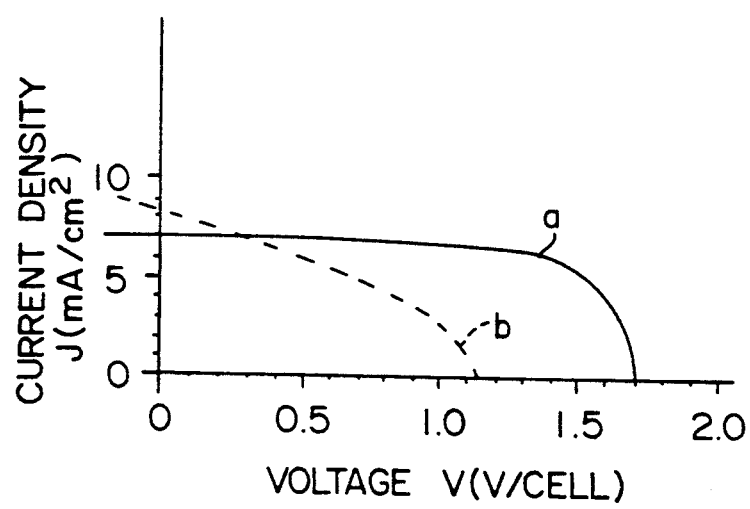
FIG. 3 shows graphs illustrating the I-V characteristics obtained under light irradiation with respect to each of the solar cells respectively comprising two photovoltaic elements being integrated in series obtained in Example 1 and Comparative Example 1.
Figure 4:
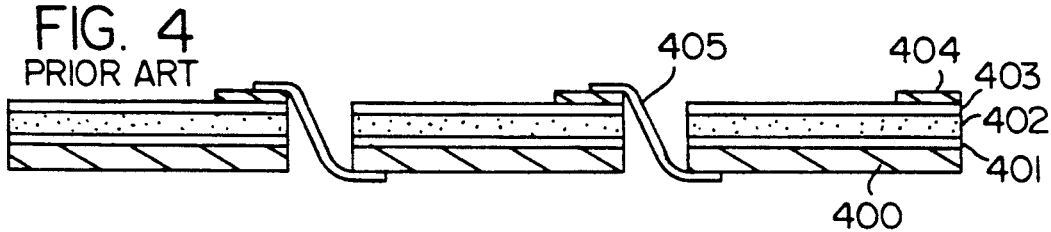
FIGS. 4 and 5(a)-5(b) are schematic diagrams respectively of known solar cells in which a conductive substrate is used.
Figure 5A:
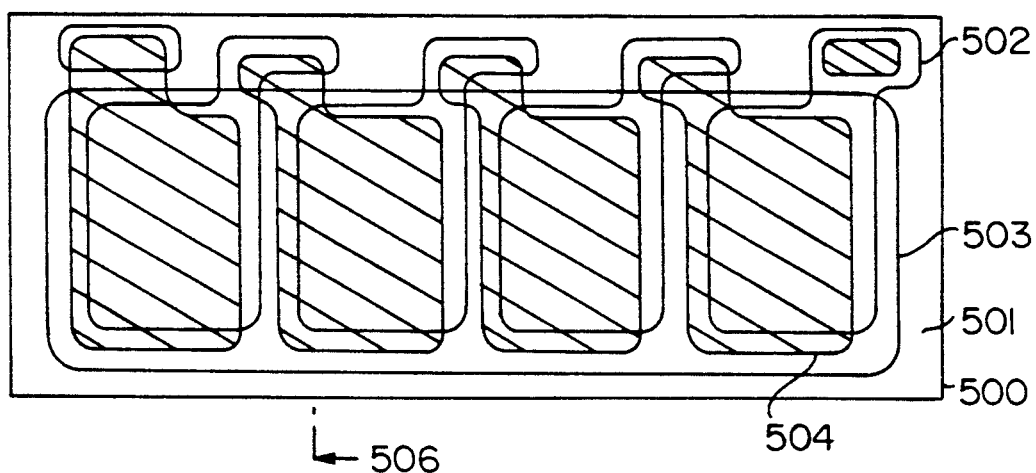
Figure 5B:
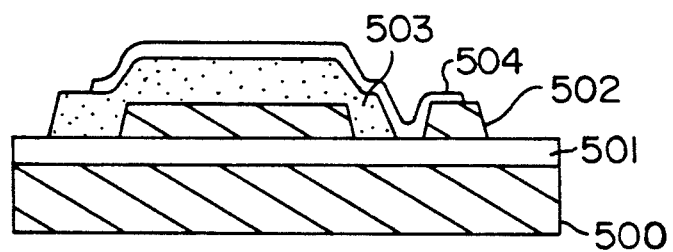

For a resultant solar cell comprising two pin junction photovoltaic elements (subcells) integrated in series, the current-voltage (I-V) characteristics under irradiation of AM-1 light (100 mW/cm$^2$) were observed. The results obtained are shown by line a in FIG. 3. From the I-V characteristics, it is understood that the open circuit voltage (Voc) is 1.7 V. This indicates the Voc which is provided in the case where two subcells are integrated in series. Thus, it is understood that no short-circuit occurred at the time of integrating the two subcells.

In addition, the solar cell obtained in the example was evaluated using a solar simulator having a spectrum approximate to AM-1 light. As a result, it exhibited an excellent photoelectric conversion efficiency of 8.2%.

EXAMPLE 2

The procedures of Example 1 were repeated, except that silicone resin was used in the formation of the second insulating layer 102, to thereby obtain a solar cell of the same constitution as that in Example 1.

In particular, the formation of the second insulating layer 102 was performed by applying a heat resistant silicone resin (trademark name: TSE 326, produced by Toshiba Silicone Company) at a thickness of 30 μm by an ink dispenser, followed by heat treatment at 150° C. for an hour.

As for the resultant solar cell comprising two photovoltaic elements (subcells) integrated in series as in Example 1, its current-voltage characteristics were observed in the same manner as in Example 1. As a result, it was determined that the solar cell of this example is also free of short-circuits.

It was found that the solar cell obtained using the silicone resin for the formation of its second insulating layer in this example excels in bending strength and has a high reliability.

EXAMPLE 3

The procedures of Example 1 were repeated, except that silicon oxide was formed using a silanol compound as the starting material in the formation of the second insulating layer 102, to thereby obtain a solar cell of the same constitution as that in Example 1.

In particular, the formation of the second insulating layer was performed as follows. That is, a material obtained by admixing 3% by weight of (Co,Ni)O(Cr,Fe)$_2$O$_3$ spinel solid solution with a silanol compound (trademark name: OCD type-785R, produced by Tokyo Ohka Kabushiki Kaisha) was applied by an ink dispenser, followed by heat treatment at 150° C. for 30 minutes, at 300° C. for 30 minutes and at 420° C. for 30 minutes, to thereby form a 10 μm thick silicon oxide film.

As for the resultant solar cell comprising two photovoltaic elements (subcells) integrated in series as in Example 1, its current-voltage characteristics were observed in the same manner as in Example 1. As a result, it was determined that the solar cell of this example is also free of short-circuits.

Further, in this example, since the second insulating layer was constituted by the silicon oxide obtained from the silanol compound, the amount of gas released in the step of forming the amorphous silicon film was slight and because of this, the resultant amorphous silicon film was of a high quality, and the resultant solar cell exhibited an improved photoelectric conversion efficiency.

EXAMPLE 4

The procedures of Example 1 were repeated, except that the second insulating layer 102 was formed using epoxy resin in which glass beads were dispersed, to thereby obtain a solar cell of the same constitution as that in Example 1.

In particular, the formation of the second insulating layer was performed as follows. That is, a paste obtained by admixing 5% by weight of glass beads of 7 μm in diameter with epoxy compounded resin (trademark name: 2068 K, produced by Three Bond Company) was screen-printed at a thickness of 15 μm, followed by heat treatment at 150° C. for 30 minutes, to thereby form an insulating film.

As for the resultant solar cell comprising two photovoltaic elements (subcells) integrated in series as in Example 1, its current-voltage characteristics were observed in the same manner as in Example 1. As a result, it is understood that the solar cell of this example is also free of short-circuits.

Further, in this example, the second insulating layer was formed using epoxy resin in which glass beads were dispersed. Because of this, the solar cell comprising a plurality of photovoltaic elements on a common conductive substrate can be provided at a reduced production cost.

EXAMPLE 5

A 0.2 mm thick aluminum foil was used as the conductive substrate 100. On this substrate there was first formed a silicon oxide film as the first insulating layer 101 by a plasma CVD method using tetraethoxysilane and $O_2$ gas.

Successively, a glass paste PLS-2401 (trademark name, produced by Nippon Denki Glass Company, composition: $PbO$—$B_2O_3$—$SiO_2$) was applied onto the first insulating layer 101 in a predetermined pattern by screen printing, followed by drying at 150° C. for 10 minutes and subjected to sintering at 550° C. for 10 minutes, to thereby form a second insulating layer 102.

Then, a 5000 Å thick Mo film as the metal electrode 103 was deposited by an electron beam evaporation method. A YAG layer 110 was irradiated on parts of the metal electrode under which the second insulating layer 102 was situated to divide the metal electrode 103 into plural parts. (See FIG. 2A.)

Next, there were successively formed a 2000 Å thick Cu layer and a 4000 Å thick In layer by an electron beam evaporation method. The resultant was treated in $H_2Se$ vapor, followed by heat treatment at 400° C. in a nitrogen atmosphere. Thereafter, there was deposited a 500 Å thick CdS layer by a sputtering method Thus there was formed a semiconductor layer 104. A 700 Å thick ZnO film as the transparent electrode layer 105 was then formed by a sputtering method. The remaining steps followed those of Example 1. Thus, there was obtained a copper indium selenide solar cell comprising an integrated plurality of photovoltaic elements (subcells).

As for the resultant solar cell comprising two photovoltaic elements (subcells) integrated in series, its current-voltage characteristics were observed in the same manner as in Example 1. As a result, the value of the open circuit voltage (Voc) was 1.0 V. This indicates the Voc which is provided in the case where two subcells are integrated in series. Thus, it is understood that no short-circuits occurred at the time of integrating the subcells.

It should be understood that the present invention is not restricted by the above examples. For instance, the semiconductor layer 104 shown in FIG. 1 may be comprised of other compound semiconductors or pn junction type polycrystal silicon semiconductors besides $CuInSe_2$/CdS. In the case of using a pn junction polycrystal silicon semiconductor, a layer doped with an impurity in a high concentration can serve also as the transparent electrode, whereby it is possible to omit the transparent electrode 105.

COMPARATIVE EXAMPLE 1

The procedures of Example 1 were repeated, except that no second insulating layer was formed, to thereby obtain an amorphous silicon solar cell.

For the resultant solar cell comprising two pin junction photovoltaic elements (subcells) integrated in series, its current-voltage (I-V) characteristics under irradiation of AM-1 light (100 mW/cm$^2$) were observed. The results obtained are shown by line b in FIG. 3. From the I-V characteristics, it is understood that the open circuit voltage (Voc) of the solar cell obtained in this comparative example is markedly inferior to the value 1.7 V which was expected to be provided by integrating two solar cell elements in series. Thus, it is understood that short-circuits occurred at the time of integrating.

In addition, the solar cell obtained in this comparative example was evaluated using the same solar simulator as used in Example 1. As a result, it exhibited a photoelectric conversion efficiency of 3.3%, which is markedly inferior to that obtained in Example 1.

COMPARATIVE EXAMPLE 2

The procedures of Example 5 were repeated, except that no second insulating layer was formed, to thereby obtain a copper indium selenide solar cell.

For the resultant solar cell comprising two photovoltaic elements (subcells) integrated in series, its current-voltage (I-V) characteristics were observed in the same manner as in Example 1. From the I-V characteristics, it was found that the open circuit voltage (Voc) of the solar cell obtained in this comparative example is 0.5V. This open circuit (Voc) is markedly inferior to that obtained in the case where no short-circuit exists. It is understood that short-circuits occurred at the time of integration of these elements.

As is apparent from the results in the foregoing examples and comparative examples, it is understood that in the solar cell according to the present invention which is provided with the second insulating layer between the first insulating layer and the metal electrode layer, since excess energy of the laser beam used upon preparing the solar cell is effectively absorbed by the second insulating layer, a plurality of photovoltaic elements can be desirably integrated on a common substrate without occurrence of short-circuits between the metal electrode layer and the conductive substrate.

Because of this, the solar cell according to the present invention can be so designed as to be capable of providing a desired electromotive force and a desired power capacity.

In addition, since the solar cell according to the present invention is provided with the first insulating layer composed of a selected specific material and the second insulating layer also composed of a selected specific material, it excels in weather resistance, shock resistance and flexibility, and it stably provides a power supply over a period of time even under a severe use of environment.

I claim:

1. A solar cell comprising a plurality of photovolatic elements serially electrically connected with each other on a common conductive substrate, each of said photovolatic elements comprising a first insulating layer, a first electrode layer, a semiconductor layer, and a second electrode layer laminated in this order on said common conductive substrate, and each pair of adjacent photovolatic elements being electrically serially connected, by electrically connecting the first electrode layer of one adjacent photovolatic element to the second electrode layer of the other adjacent photovolatic element, characterized in that a second insulating layer is disposed between said first insulating layer and the end portion of said first electrode layer and a second insulating layer is disposed between the region of said first electrode layer serving to perform said serial electrical connection and said first insulating layer.

2. A solar cell according to claim 1, wherein said second insulating layer is of a thicknesses of 10 to 50 $\mu$m.

3. A solar cell according to claim 1, wherein said first insulating layer is of a thickness of 3000 Å to 2 $\mu$m.

4. A solar cell according to claim 1, wherein said first insulating layer is composed of an inorganic material.

5. A solar cell according to claim 1, wherein said second insulating layer is composed of a resin.

6. A solar cell according to claim 5, wherein said second insulating layer is composed of polyimide resin.

7. A solar cell according to claim 5, wherein said second insulating layer is composed of silicone resin.

8. A solar cell according to claim 1, wherein said second insulating layer is composed of silicon oxide obtained from a silanol compound.

9. A solar cell according to claim 1, wherein said second insulating layer is composed of an epoxy resin in which glass beads are dispersed.

10. A solar cell according to claim 1, wherein said second insulating layer is composed of glass obtained from a glass paste.

11. A solar cell according to claim 1, wherein said second insulating layer contains an inorganic pigment, amorphous carbon, or alumina which is capable of absorbing a laser beam.

* * * * *

UNITED STATES PATENT AND TRADEMARK OFFICE
CERTIFICATE OF CORRECTION

PATENT NO. : 5,328,519
DATED : July 12, 1994
INVENTOR(S) : SOICHIRO KAWAKAMI

It is certified that error appears in the above-identified patent and that said Letters Patent is hereby corrected as shown below:

ON TITLE PAGE

In [57] ABSTRACT, Line 15:

"insulating" should read --insulating layer--.

COLUMN 4

Line 42, "cf" should read --of--.

COLUMN 6

Line 51, "and-$NH_3$" should read --and $NH_3$--.

COLUMN 11

Line 14, "photovolatic" should read --photovoltaic--.
Line 17, "photovolatic" should read --photovoltaic--.
Line 21, "photovolatic" should read --photovoltaic--.
Line 23, "photovolatic" should read --photovoltaic--.
Line 24, "photovolatic" should read --photovoltaic--.

UNITED STATES PATENT AND TRADEMARK OFFICE
CERTIFICATE OF CORRECTION

PATENT NO. : 5,328,519
DATED : July 12, 1994
INVENTOR(S) : SOICHIRO KAWAKAMI

Page 2 of 2

It is certified that error appears in the above-identified patent and that said Letters Patent is hereby corrected as shown below:

COLUMN 12

Line 4, "thicknesses" should read --thickness--.

Signed and Sealed this

Twenty-first Day of February, 1995

Attest:

BRUCE LEHMAN

Attesting Officer

Commissioner of Patents and Trademarks